United States Patent
Ebe et al.

(10) Patent No.: US 8,354,599 B2
(45) Date of Patent: Jan. 15, 2013

(54) CONNECTION STRUCTURE BETWEEN PRINTED CIRCUIT BOARD AND ELECTRONIC COMPONENT

(75) Inventors: Hirofumi Ebe, Ibaraki (JP); Yasuto Ishimaru, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 423 days.

(21) Appl. No.: 12/163,062

(22) Filed: Jun. 27, 2008

(65) Prior Publication Data

US 2009/0011617 A1    Jan. 8, 2009

(30) Foreign Application Priority Data

Jul. 2, 2007    (JP) .................................. 2007-174420

(51) Int. Cl.
*H05K 1/11* (2006.01)
(52) U.S. Cl. ........................................ 174/261; 361/777
(58) Field of Classification Search .......... 361/767–779; 174/260, 261
See application file for complete search history.

(56) References Cited

U.S. PATENT DOCUMENTS

| | | | | |
|---|---|---|---|---|
| 6,437,253 | B1 * | 8/2002 | Saito et al. ..................... | 174/261 |
| 6,740,822 | B2 * | 5/2004 | Watanabe ..................... | 174/260 |
| 7,087,844 | B2 * | 8/2006 | Ishimaru et al. .............. | 174/250 |
| 7,301,103 | B2 * | 11/2007 | Tanaka et al. ................. | 174/250 |
| 7,391,116 | B2 * | 6/2008 | Chen et al. .................... | 257/762 |
| 7,671,454 | B2 * | 3/2010 | Seko .............................. | 257/668 |
| 2004/0101993 | A1 * | 5/2004 | Salmon .......................... | 438/107 |

FOREIGN PATENT DOCUMENTS

| | | |
|---|---|---|
| EP | 0373241 A1 | 6/1990 |
| EP | 1545170 A1 | 6/2005 |
| JP | 10178262 A | 6/1998 |
| JP | 2000098412 | 7/2000 |
| JP | 2001358170 A | 12/2001 |
| JP | 2003100804 A | 4/2003 |
| JP | 2003176473 A | 6/2003 |
| JP | 2006-013421 A | 1/2006 |

OTHER PUBLICATIONS

EP Search Report issued on Apr. 27, 2010 in EP Application No. EP 08 25 2172.
Office Action issued Sep. 27, 2011 in JP Patent Application No. 2007-174420.
Office Action issued Sept. 27, 2011 in JP Patent Application No. 2007-174420.
Office Action issued Oct. 18, 2011 in EP Patent Application No. 08252172.5.

* cited by examiner

*Primary Examiner* — Yuriy Semenenko
(74) *Attorney, Agent, or Firm* — Panitch Schwarze Belisario & Nadel LLP

(57) ABSTRACT

Each wiring pattern is composed of a conductor layer and a tin plating layer, and includes a tip portion, a connection portion and a signal transmission portion. The width of the tip portion is equal to the width of the signal transmission portion, and the width of the connection portion is smaller than the widths of the tip portion and the signal transmission portion. The connection portions of wiring patterns and bumps of an electronic component are connected to one another, respectively, by heat-sealing when the electronic component is mounted. Respective distances A1, A2 are set to not less than 0.5 μm. Respective distances B1, B2 are set to not less than 20 μm. The thickness of the tin plating layer is set to not less than 0.07 μm and not more than 0.25 μm.

4 Claims, 7 Drawing Sheets

F I G. 7
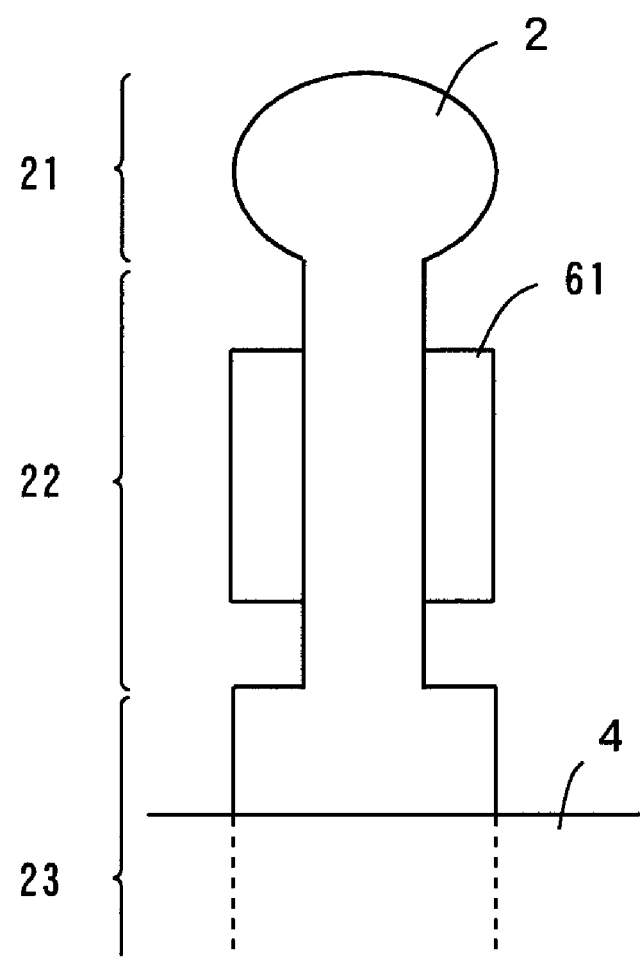

CONNECTION STRUCTURE BETWEEN PRINTED CIRCUIT BOARD AND ELECTRONIC COMPONENT

BACKGROUND OF THE INVENTION

1. Field of the Invention

The present invention relates to a connection structure between a printed circuit board and an electronic component.

2. Description of the Background Art

Various types of electronic components such as semiconductor chips are mounted on a printed circuit board. In this case, a terminal portion of the printed circuit board and a terminal of the electronic component are connected to each other by heat-sealing, for example (see JP 2006-13421 A, for example). Specifically, for example, a tin (Sn) plating layer is formed so as to cover a surface of the terminal portion of the printed circuit board, and the tin plating layer on the terminal portion is melted by heat at the time of mounting the electronic component. This causes the terminal portion of the printed circuit board and the terminal of the electronic component to be reliably connected to each other.

As the pitch of the printed circuit board is made finer, however, distances between the adjacent terminal portions are reduced. This may cause the melted tin plating layers on the adjacent terminal portions to come into contact with one another at the time of heat-sealing, resulting in short circuits.

SUMMARY OF THE INVENTION

An object of the present invention is to provide a connection structure between a printed circuit board and an electronic component in which occurrence of short circuits at the time of heat-sealing is prevented.

(1) According to an aspect of the present invention, a connection structure between a printed circuit board and an electronic component is a connection structure between the printed circuit board and a terminal of the electronic component, wherein the printed circuit board includes an insulating layer, and a conductor pattern having a line shape and being formed on the insulating layer, the conductor pattern includes a terminal portion, the terminal portion includes a first region having a first width and a second region having a second width smaller than the first width, and at least the second region is covered with a plating layer including tin and having a thickness of not less than 0.07 μm and not more than 0.25 μm, the terminal of the electronic component and the second region of the printed circuit board are heat-sealed, one lateral side of the second region is positioned more inward than one lateral side of the terminal of the electronic component by not less than 0.5 μm, and the other lateral side of the second region is positioned more inward than the other lateral side of the terminal of the electronic component by not less than 0.5 μm, and an interval of not less than 20 μm is formed between the first region and the terminal of the electronic component in a direction perpendicular to a width direction of the terminal portion.

In the connection structure between the printed circuit board and the electronic component according to the present invention, the plating layer including tin and covering the second region of the printed circuit board is melted by heat while the second region of the printed circuit board and the terminal of the electronic component are in contact with each other. The plating layer is then cured, so that the second region of the printed circuit board and the terminal of the electronic component are heat-sealed.

In this case, the one lateral side of the second region of the printed circuit board is positioned more inward than the one lateral side of the terminal of the electronic component by not less than 0.5 μm, and the other lateral side of the second region is positioned more inward than the other lateral side of the terminal of the electronic component by not less than 0.5 μm, so that the heat-melted plating layer is prevented from spreading to the outside of the terminal of the electronic component.

In addition, the interval of not less than 20 μm is formed between the first region and the terminal of the electronic component in the direction perpendicular to the width direction of the terminal portion, thereby preventing the heat-melted plating layer from flowing from the first region onto the terminal of the electronic component. This more sufficiently prevents the heat-melted plating layer from spreading to the outside of the terminal of the electronic component.

Furthermore, the thickness of not less than 0.07 μm of the plating layer ensures reliability of connection between the terminal portion and the terminal of the electronic component while the thickness of not more than 0.25 μm of the plating layer prevents the amount of the plating layer that is to be melted by heat from being excessive.

This reliably prevents the heat-melted tin plating layer from spreading to the outside of the terminal of the electronic component. Accordingly, even when a plurality of terminals are provided in proximity to one another in the electronic component and a plurality of terminal portions are provided in proximity to one another in the printed circuit board, the heat-melted plating layers on the adjacent terminal portions are prevented from coming into contact with one another. As a result, occurrence of short circuits between the adjacent terminal portions is prevented.

Moreover, since the width of the first region is larger than the width of the second region in the terminal portion, adhesion between the terminal portion and the base insulation layer is ensured. Thus, the terminal portion is prevented from being removed from the base insulating layer.

(2) The both lateral sides of the second region may be positioned more inward than both lateral sides of the first region, respectively.

In this case, the heat-melted plating layer is sufficiently prevented from spreading more outward than the first region on both sides of the second region. This more reliably prevents occurrence of short circuits between the adjacent terminal portions.

(3) The printed circuit board may further include a cover insulating layer formed on the base insulating layer so as to cover the conductor pattern excluding the terminal portion.

In this case, the conductor patterns are prevented from being damaged and removed from the base insulating layer.

(4) The terminal of the electronic component may include a plurality of terminals provided at intervals of not more than 10 μm, and the terminal portion of the printed circuit board may include a plurality of terminal portions provided so as to correspond to the plurality of terminals of the electronic component.

In this case, occurrence of short circuits between the terminal portions is prevented while the pitch of the printed circuit board can be made finer.

Other features, elements, characteristics, and advantages of the present invention will become more apparent from the following description of preferred embodiments of the present invention with reference to the attached drawings.

BRIEF DESCRIPTION OF THE DRAWINGS

FIG. 7 is a plan view showing a modification of the wiring pattern.

DESCRIPTION OF THE PREFERRED EMBODIMENTS

Hereinafter, a connection structure between a printed circuit board and an electronic component according to an embodiment of the present invention will be described while referring to drawings.

(1) Structure

FIG. 1(a) is a plan view of the printed circuit board according to the present embodiment, and FIG. 1(b) is a sectional view taken along the line P-P of the printed circuit board of FIG. 1(a).

As shown in FIGS. 1(a) and (b), the printed circuit board 50 includes a base insulating layer 1 made of polyimide, for example. A rectangular region S is provided on the base insulating layer 1. A plurality of wiring patterns 2 are formed so as to extend from the inside of the region S to the outside thereof beyond respective two sides that are opposed to each other.

Figure 1:
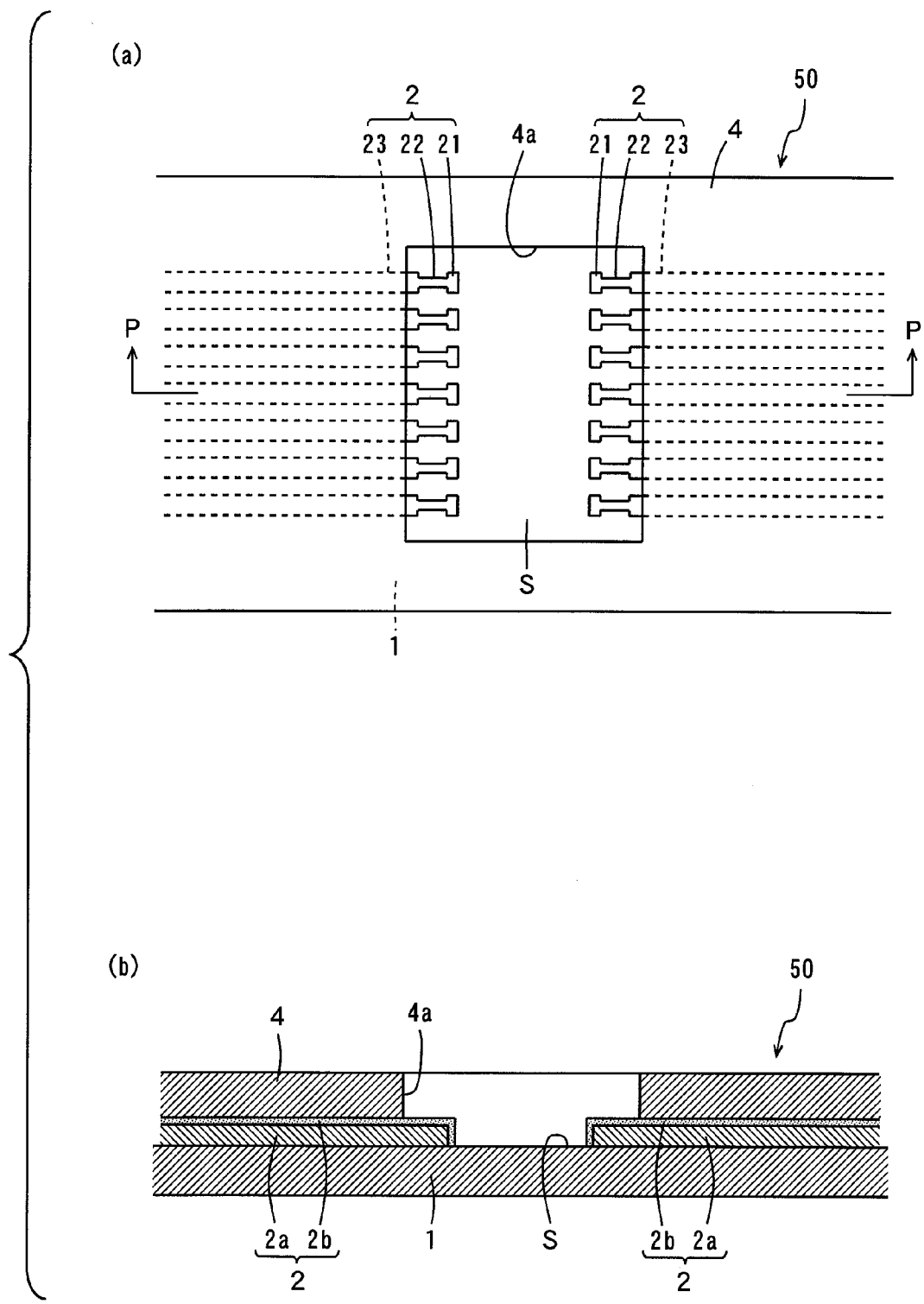
FIG. 1 is a diagram showing a printed circuit board according to an embodiment of the present invention.

Each of the wiring patterns 2 includes a tip portion 21, a connection portion 22 and a signal transmission portion 23 (FIG. 1(a)). The tip portion 21 and the signal transmission portion 23 have an equal width, and the connection portion 22 has a width smaller than the widths of the tip portion 21 and the signal transmission portion 23. In the present embodiment, the tip portion 21 and the connection portion 22 constitute a terminal portion. In the example of FIG. 1, the tip portions 21, the connection portions 22 and respective parts of the signal transmission portions 23 are positioned on the region S of the base insulating layer 1.

In addition, each of the wiring patterns 2 includes a conductor layer 2a and a tin plating layer 2b (FIG. 1(b)). The conductor layer 2a is made of copper, for example, and formed on the base insulating layer 1. The tin plating layer 2b is formed so as to cover a surface of the conductor layer 2a.

A cover insulating layer 4 made of polyimide, for example, is formed on the base insulating layer 1 so as to cover the plurality of wiring patterns 2. The cover insulating layer 4 has an opening 4a positioned above the region S. The tip portions 21, the connection portions 22 and the respective parts of the signal transmission portions 23 of the wiring patterns 2 are exposed in the opening 4a of the cover insulating layer 4.

Either a subtractive method or a semi-additive method may be used as a manufacturing method of the printed circuit board 50. Moreover, the subtractive method and the semi-additive method may be combined.

Figure 2:
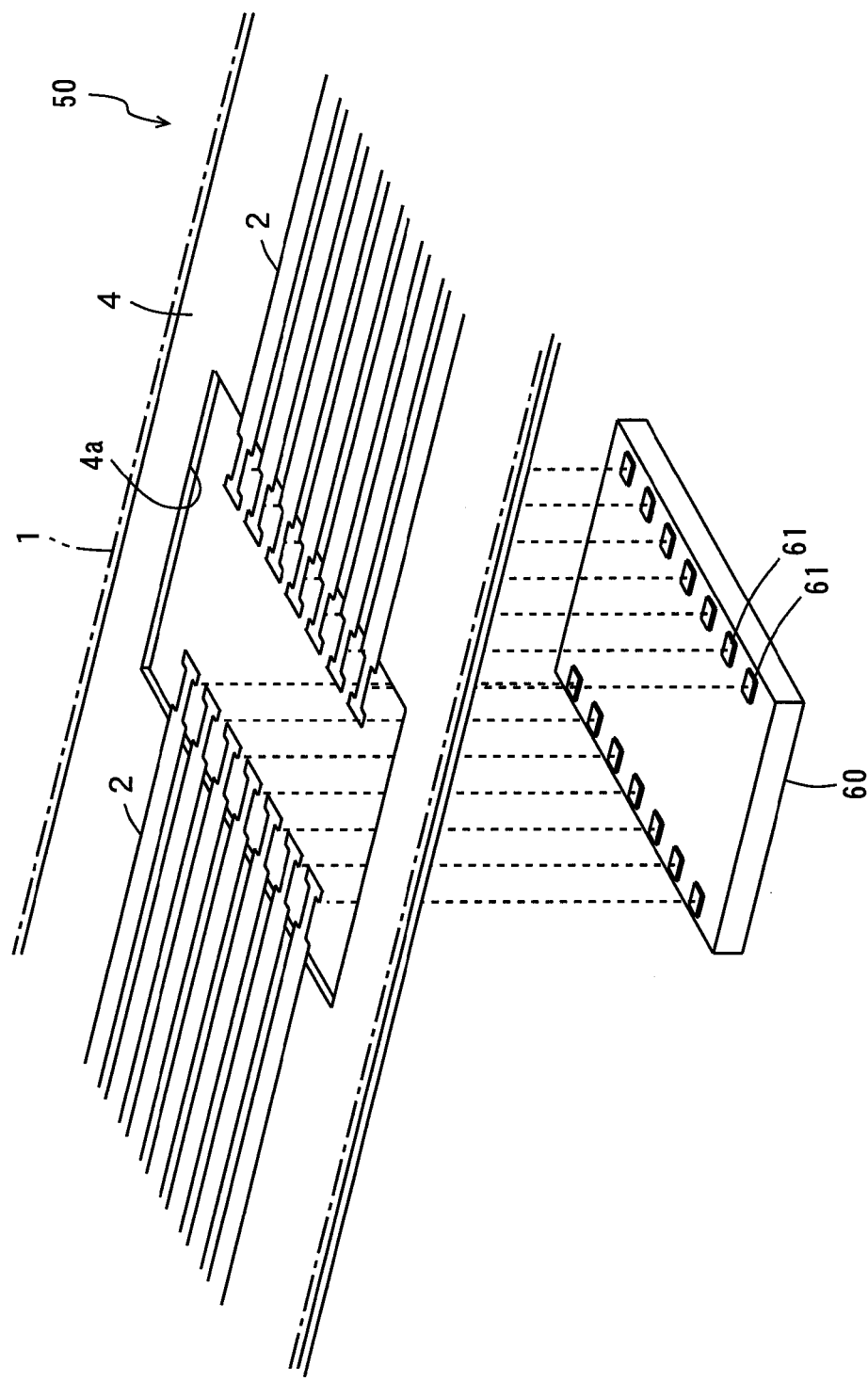
FIG. 2 is a diagram showing a connection structure between the printed circuit board and an electronic component.

(2) The Connection Between the Printed Circuit Board and the Electronic Component Next, the connection structure between the printed circuit board 50 shown in FIG. 1 and the electronic component is described. FIG. 2 is a perspective view showing the connection structure between the printed circuit board 50 and the electronic component. FIG. 3(a) is a plan view showing the connection structure between the printed circuit board 50 and the electronic component, and FIG. 3(b) is a sectional view taken along the line Q-Q of FIG. 3(a).

Figure 3:
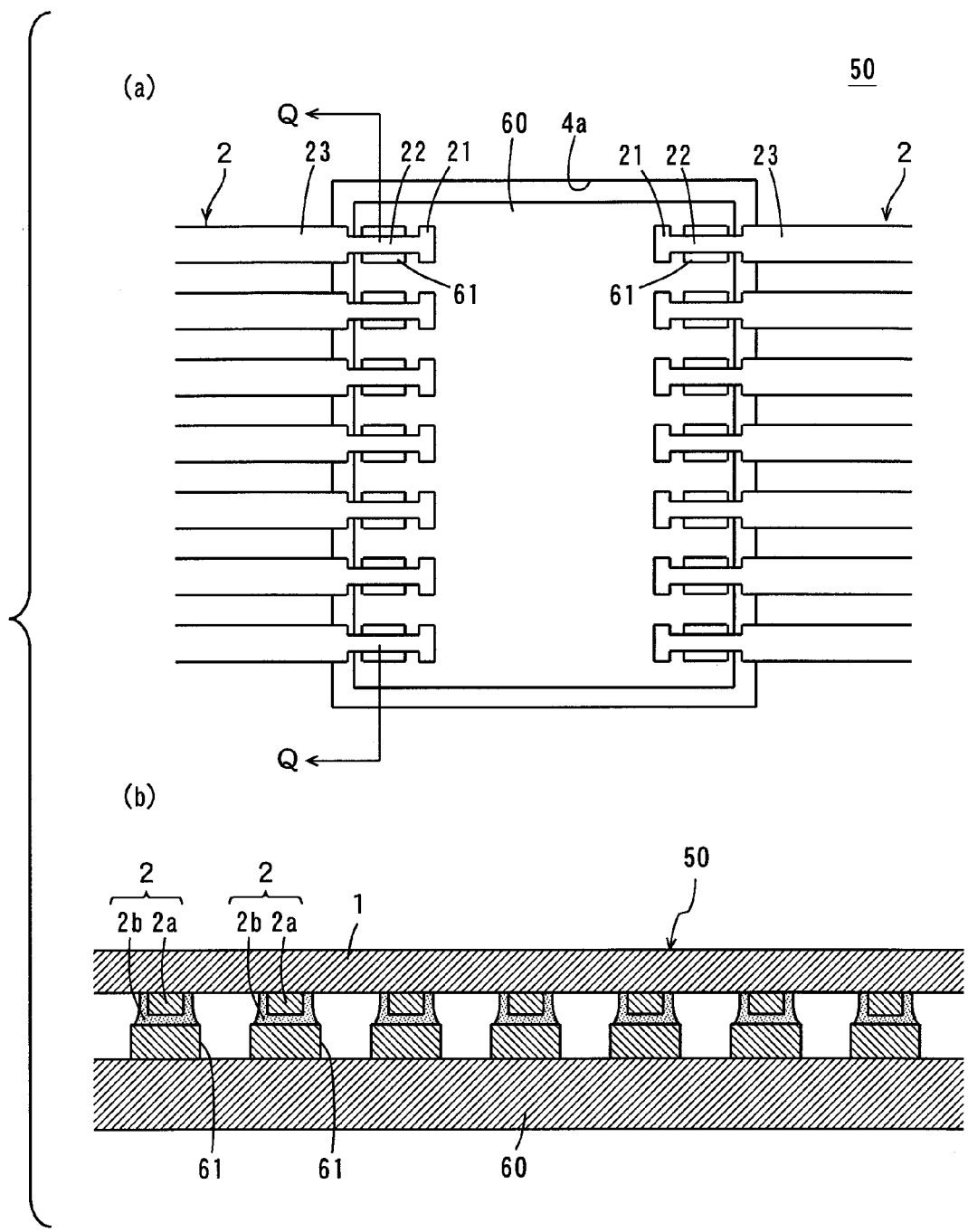
FIG. 3 is a diagram showing the connection structure between the printed circuit board and the electronic component.

Note that the printed circuit board 50 with the cover insulating layer 4 directed downward is shown in FIGS. 2 and 3. The base insulating layer 1 is shown in a transparent state in order to clearly illustrate the connection structure between the printed circuit board 50 and the electronic component.

The electronic component 60 shown in FIGS. 2 and 3 is a semiconductor chip, for example. As shown in FIG. 2, a plurality of convex-shaped bumps 61 are provided on one surface of the electronic component 60 so as to be along two sides thereof parallel to each other. The number and arrangement of the wiring patterns 2 of the printed circuit board 50 are set corresponding to the number and arrangement of the bumps 61 of the electronic component 60.

As shown in FIGS. 3(a) and (b), the connection portions 22 of the wiring patterns 2 of the printed circuit board 50 and the bumps 61 of the electronic component 60 are connected to one another, respectively, by heat-sealing when the electronic component 60 is mounted. That is, the tin plating layers 2b (FIG. 3(b)) of the connection portions 22 are melted by heat and subsequently cured in a state where the connection portions 22 of the wiring patterns 2 and the bumps 61 are in contact with one another, respectively, so that the connection portions 22 and the bumps 61 are heat-sealed.

In the present embodiment, the tip portion 21, the connection portion 22 and the signal transmission portion 23 of each wiring pattern 2 are formed in respective predetermined shapes, so that adhesion between each wiring pattern 2 and the base insulating layer 1 is ensured while occurrence of short circuits during the heat-sealing is prevented.

Figure 4:
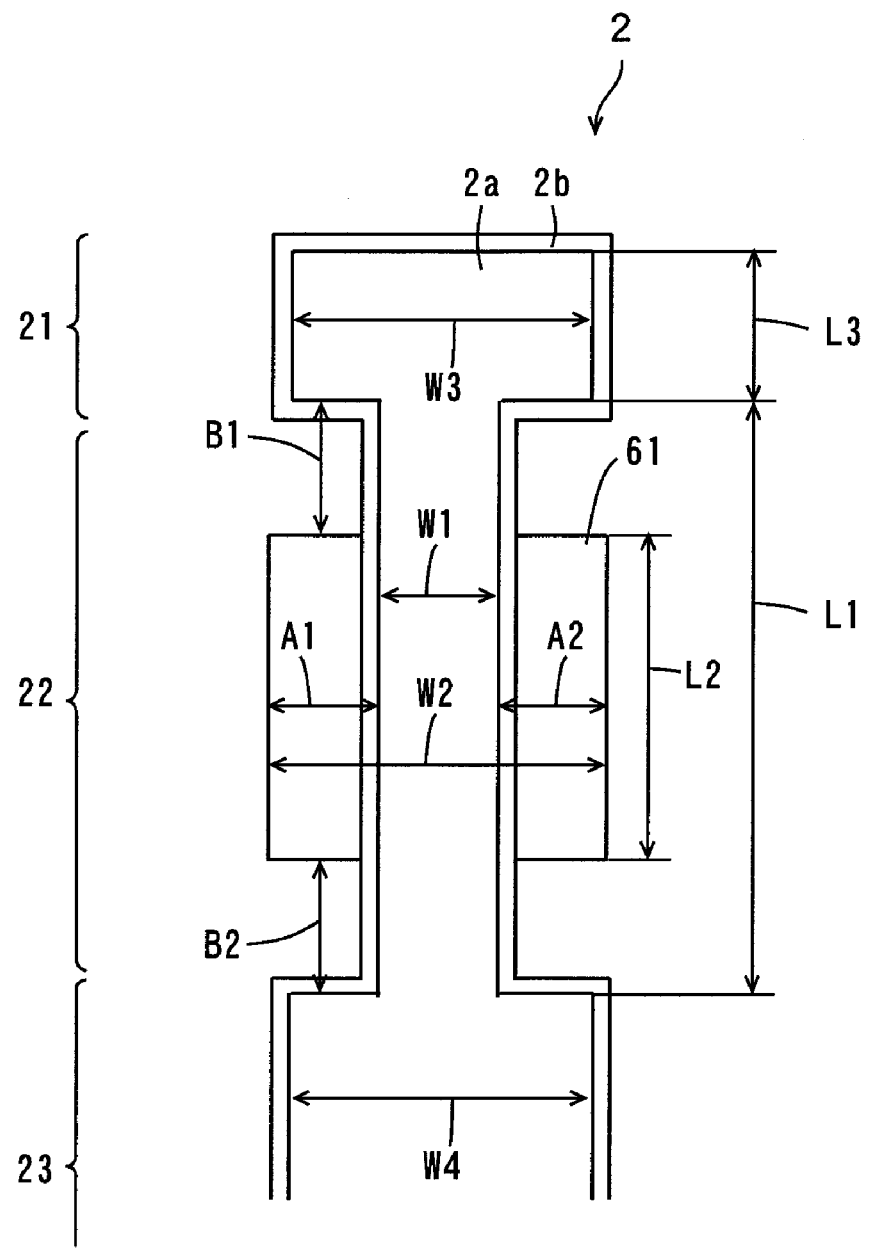
FIG. 4 is a plan view for explaining details of a wiring pattern of the printed circuit board and a bump of the electronic component.

(3) Details of the Terminal Portion of the Printed Circuit Board and the Bump of the Electronic Component Here, details of the wiring pattern 2 of the printed circuit board 50 and the bump 61 of the electronic component 60 are described. FIG. 4 is a plan view for explaining details of the wiring pattern 2 of the printed circuit board 50 and the bump 61 of the electronic component 60.

As shown in FIG. 4, the width (hereinafter referred to as the connection conductor width) W1 of the conductor layer 2a in the connection portion 22 of the wiring pattern 2 is set smaller than the length (hereinafter referred to as the bump width) W2 of the bump 61 of the electronic component 60 in the width direction of the wiring pattern 2. The length (hereinafter referred to as the connection conductor length) L1 of the conductor layer 2a in the connection portion 22 is set larger than the length (hereinafter referred to as the bump length) L2 of the bump 61 in the length direction of the wiring pattern 2.

The distance A1 between one side, along the length direction, of the conductor layer 2a in the connection portion 22 of the wiring pattern 2 and one side, along the length direction, of the bump 61 and the distance A2 between the other side, along the length direction, of the conductor layer 2a in the connection portion 22 and the other side, along the length direction, of the bump 61 are set to not less than 0.5 μm, respectively.

Figure 5:
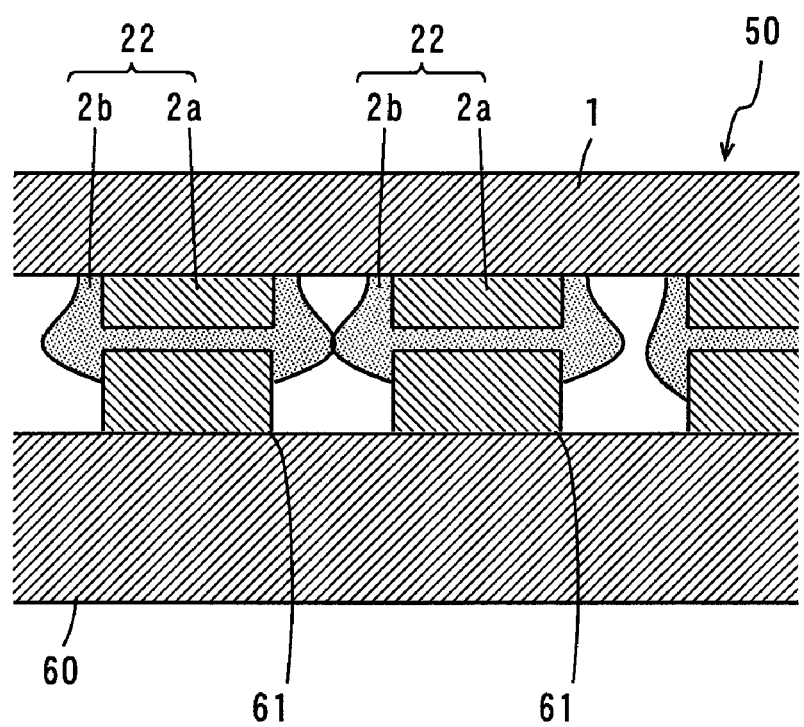
FIG. 5 is a schematic side view showing a problem of a conventional printed circuit board.

When the respective distances A1, A2 are shorter than 0.5 μm, the following problem arises. FIG. 5 is a schematic side view showing the problem that arises when the respective distances A1, A2 are short. When the respective distances A1, A2 are short, the heat-melted tin plating layers 2b are liable to spread to the outside of the respective bumps 61 during the heat-sealing of the connection portions 22 and the bumps 61 as shown in FIG. 5. Therefore, the heat-melted tin plating layers 2b on the adjacent connection portions 22 come into contact with one another, resulting in occurrence of short circuits in some cases.

In contrast, when the respective distances A1, A2 are not less than 0.5 μm, the heat-melted tin plating layers 2b are prevented from spreading to the outside of the bumps 61 as shown in FIG. 3(b). Accordingly, short circuits between the adjacent connection portions 22 are prevented.

In addition, the respective distances A1, A2 are preferably not more than 5 μm. In this case, the connection conductor width W1 can be maintained in an appropriate size by setting the respective distances A1, A2 to not more than 5 μm. That is, the connection conductor width W1 is prevented from becoming too small. Thus, reliability of connection between the connection portion 22 and the bump 61 is ensured.

Furthermore, the respective distances A1, A2 are more preferably not less than 2 μm and not more than 5 μm in order to more reliably ensure the reliability of connection between the connection portion 22 and the bump 61 and more reliably prevent short circuits between the adjacent connection portions 22.

The connection conductor width W1 is preferably not less than 10 μm and not more than 18 μm. The bump width W2 is preferably not less than 12 μm and not more than 20 μm.

The distance B1 between one side, along the width direction, of the conductor layer 2a in the tip portion 21 of the wiring pattern 2 and one side, along the width direction, of the bump 61 and the distance B2 between one side, along the width direction, of the conductor layer 2a in the signal transmission portion 23 and the other side, along the width direction, of the bump 61 are set to not less than 20 μm, respectively.

In this case, the heat-melted tin plating layer 2b in a portion, in the vicinity of the connection portion 22, of the tip portion 21 or the signal transmission portion 23 of the wiring pattern 2 is prevented from flowing onto the bump 61. This prevents the heat-melted tin plating layer 2b from spreading to the outside of the bump 61 and prevents occurrence of short circuits between the connection portions 22.

Moreover, the respective distances B1, B2 are preferably not more than 30 μm, respectively. In this case, adhesion between the conductor layer 2a and the base insulating layer 1 is reliably ensured.

Furthermore, the respective distances B1, B2 are more preferably not less than 20 μm and not more than 25 μm in order to more reliably ensure adhesion between the conductor layer 2a and the base insulating layer 1 and more reliably prevent occurrence of short circuits between the connection portions 22.

The connection conductor length L1 is preferably not less than 120 μm and not more than 140 μm. The bump length L2 is preferably not less than 60 μm and not more than 80 μm.

The width (hereinafter referred to as the tip conductor width) W3 of the conductor layer 2a in the tip portion 21 of the wiring pattern 2 and the width (hereinafter referred to as the transmission conductor width) W4 of the conductor layer 2a in the signal transmission portion 23 of the wiring pattern 2 are preferably not less than 12 μm and not more than 20 μm, respectively. The length (hereinafter referred to as the tip conductor length) L3 of the conductor layer 2a in the tip portion 21 is preferably not less than 16 μm and not more than 20 μm. In this case, adhesion between the conductor layer 2a and the base insulating layer 1 is sufficiently ensured.

The thickness of the tin plating layer 2b is set to not less than 0.07 μm and not more than 0.25 μm. In this case, the reliability of connection between the connection portion 22 and the bump 61 of the electronic component 60 is ensured by setting the thickness of the tin plating layer 2b to not less than 0.07 μm. Moreover, the amount of the tin plating layer 2b that is to be melted by heat is prevented from being excessive by setting the thickness of the tin plating layer 2b to not more than 0.25 μm. This prevents the heat-melted tin plating layer 2b from spreading to the outside of the bump 61 and prevents occurrence of short circuits between the connection portions 22.

Furthermore, the thickness of the tin plating layer 2b is more preferably not less than 0.10 μm and not more than 0.20 μm in order to more reliably ensure the reliability of connection between the connection portion 22 and the bump 61 and more reliably prevent occurrence of short circuits between the connection portions 22.

The distance between the adjacent bumps 61 of the electronic component 60 is preferably not less than 8 μm and not more than 10 μm. In this case, occurrence of short circuits between the connection portions 22 is prevented while the pitch of the printed circuit board 50 is made finer.

(4) Inventive Examples and Comparative Examples

A two-layer base material composed of polyimide and a copper foil was prepared and the copper foil was etched in a predetermined pattern, thus forming the conductor layers 2a on the base insulating layer 1. Next, the surfaces of the conductor layers 2a were covered with the tin plating layers 2b, so that the wiring patterns 2 were formed. The cover insulating layer 4 was subsequently formed on the base insulating layer 1 so as to cover the plurality of wiring patterns 2, so that the printed circuit board 50 was obtained. In addition, a semiconductor chip having a plurality of gold (Au) bumps was prepared as the electronic component 60.

The above-described distances A1, A2 and distances B1, B2 were set to various values by adjusting the tip conductor width W3, the transmission conductor width W4, the connection conductor width W1 and the connection conductor length L1 of the printed circuit board 50. Moreover, the thickness of the tin plating layer 2b was set to various values.

Note that the tip conductor length L3 was set to 18 μm. In addition, the bump width W2 of the bump 61 of the electronic component 60 was 18 μm, and the bump length L2 was 80 μm. Intervals between the adjacent bumps 61 in the bump width direction were 9 μm.

(4-1) Inventive Examples 1 to 6

TABLE 1

|  |  | Inventive Example 1 | Inventive Example 2 | Inventive Example 3 | Inventive Example 4 | Inventive Example 5 | Inventive Example 6 |
|---|---|---|---|---|---|---|---|
|  | A1(=A2) | 0.5 | 0.6 | 1 | 1 | 1 | 1 |
|  | B1(=B2) | 25 | 25 | 25 | 20 | 25 | 25 |
| Thickness of Tin Plating (μm) |  | 0.15 | 0.15 | 0.15 | 0.15 | 0.07 | 0.25 |
| Size of Conductor Layer (μm) | W3(=W4) | 18 | 18 | 18 | 18 | 18 | 18 |
|  | W1 | 17 | 16.8 | 16 | 16 | 16 | 16 |
|  | L1 | 130 | 130 | 130 | 120 | 130 | 130 |
| Size of Bump (μm) | W2 | 18 | 18 | 18 | 18 | 18 | 18 |
|  | L2 | 80 | 80 | 80 | 80 | 80 | 80 |
| Intervals between Bumps (μm) |  | 9 | 9 | 9 | 9 | 9 | 9 |

As shown in Table 1, the distances A1, A2 were equally set in a range of not less than 0.5 μm and not more than 1 μm, and the distances B1, B2 were equally set in a range of not less than 20 μm and not more than 25 μm in the inventive examples 1 to 6. The thickness of the tin plating layer 2*b* was set in a range of not less than 0.07 μm and not more than 0.25 μm.

(4-2) Comparative Examples 1 to 4

TABLE 2

|  |  | Comparative Example 1 | Comparative Example 2 | Comparative Example 3 | Comparative Example 4 |
|---|---|---|---|---|---|
|  | A1(=A2) | 0.1 | 1 | 1 | 1 |
|  | B1(=B2) | 25 | 15 | 25 | 25 |
| Thickness of Tin Plating (μm) |  | 0.15 | 0.15 | 0.05 | 0.28 |
| Size of Conductor Layer (μm) | W3(=W4) | 18 | 18 | 18 | 18 |
|  | W1 | 17.8 | 16 | 16 | 16 |
|  | L1 | 130 | 110 | 130 | 130 |
| Size of Bump (μm) | W2 | 18 | 18 | 18 | 18 |
|  | L2 | 80 | 80 | 80 | 80 |
| Intervals between Bumps (μm) |  | 9 | 9 | 9 | 9 |

As shown in Table 2, the distances A1, A2 were equally set in a range of not less than 0.1 μm and not more than 1 μm, and the distances B1, B2 were equally set in a range of not less than 15 μm and not more than 25 μm in the comparative examples 1 to 4. The thickness of the tin plating layer 2*b* was set in a range of not less than 0.05 μm and not more than 0.28 μm.

(4-3) Evaluation

The connection portion 22 of the printed circuit board 50 and the bump 61 of the electronic component 60 were connected to each other by heat-sealing under the conditions shown in the inventive examples 1 to 6 and the comparative examples 1 to 4, and rates of occurrence of short circuits were examined. The results are shown in Table 3. Here, short circuits mean a case where the heat-melted tin plating layers 2*b* on the adjacent connection portions 22 come into contact with one another as shown in FIG. 5.

TABLE 3

|  | Rate of Occurrence of Short Circuits (%) |
|---|---|
| Inventive Example 1 | 0 |
| Inventive Example 2 | 0 |
| Inventive Example 3 | 0 |
| Inventive Example 4 | 0 |
| Inventive Example 5 | 0 |
| Inventive Example 6 | 0 |
| Comparative Example 1 | 70 |
| Comparative Example 2 | 20 |
| Comparative Example 3 | 0 |
| Comparative Example 4 | 40 |

As shown in Tables 1 to 3, although short circuits did not occur in the inventive examples 1 to 3 in which the respective distances A1, A2 were set in the range of not less than 0.5 μm and not more than 1 μm, short circuits occurred in the comparative example 1 in which the respective distances A1, A2 were set to 0.1 μm. This indicates that occurrence of short circuits can be prevented by setting the respective distances A1, A2 to not less than 0.5 μm.

In addition, although short circuits did not occur in the inventive example 4 in which the respective distances B1, B2 were 20 μm, short circuits occurred in the comparative example 2 in which the respective distances B1, B2 were 15 μm. This indicates that the occurrence of short circuits can be prevented by setting the respective distances B1, B2 to not less than 20 μm.

Moreover, although short circuits did not occur in the inventive example 5 in which the thickness of the tin plating layer 2*b* was set to 0.07 μm and in the inventive example 6 in which the thickness was set to 0.25 μm, short circuits occurred in the comparative example 4 in which the thickness of the tin plating layer 2*b* was set to 0.28 μm. In the comparative example 3 in which the thickness of the tin plating layer 2*b* was set to 0.05 μm, an electrical connection between the connection portion 22 and the bump 61 was defective, although short circuits did not occur. This indicates that the occurrence of short circuits can be prevented by setting the thickness of the tin plating layer 2*b* in the range of not less than 0.07 μm and not more than 0.25 μm.

As a result, it was found that the occurrence of short circuits can be sufficiently prevented by setting the respective distances A1, A2 to not less than 0.5 μm, the respective distances B1, B2 to not less than 20 μm, and the thickness of the tin plating layer 2*b* in the range of not less than 0.07 μm and not more than 0.25 μm.

(5) Other Embodiments

Figure 6:
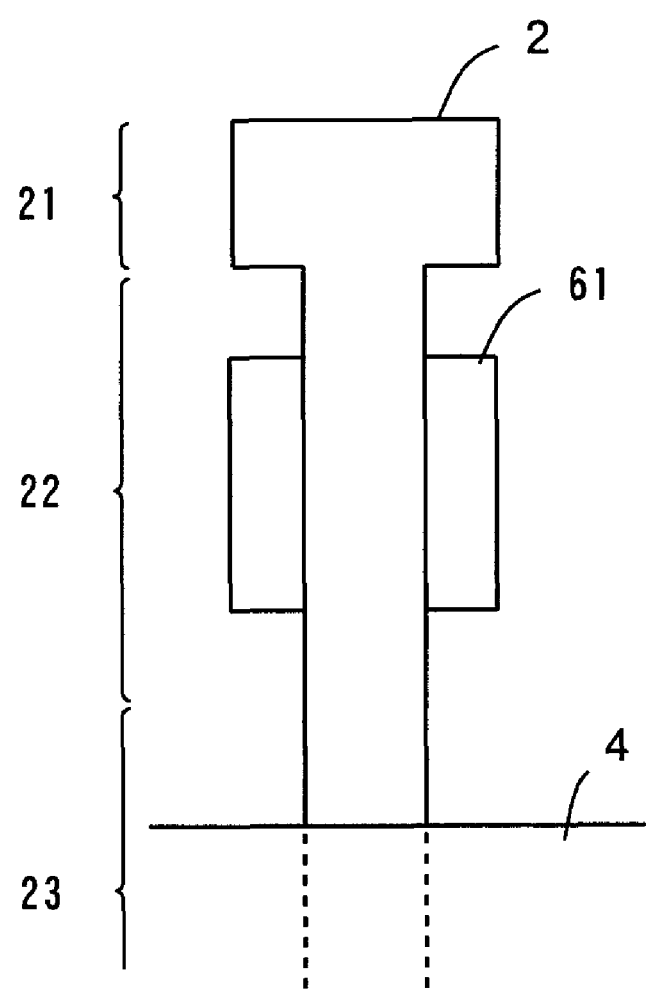
FIG. 6 is a plan view showing a modification of the wiring pattern.

While the width of the signal transmission portion 23 of the wiring pattern 2 is set larger than the width of the connection portion 22 in the above-described embodiment, the present invention is not limited to this. FIG. 6 is a plan view showing a modification of the wiring pattern 2. In the example of FIG. 6, the width of the signal transmission portion 23 of the wiring pattern 2 is set equally to the width of the connection portion 22. Note that adhesion between the signal transmission portion 23 and the base insulating layer 1 is ensured by covering the signal transmission portion 23 with the cover insulating layer 4.

While the tip portion 21 of the wiring pattern 2 has a rectangular shape in the above-described embodiment, the tip portion 21 can be formed in an arbitrary shape if adhesion between the tip portion 21 and the base insulating layer 1 is sufficiently ensured. For example, the tip portion 21 of the wiring pattern 2 may be formed in a substantially circular shape as shown in FIG. 7. The tip portion 21 of the wiring pattern 2 may be formed in another shape such as a triangular shape and a U-shape.

A material for the base insulating layer 1 and the cover insulating layer 4 is not limited to polyimide. For example, another insulating material such as a polyimide film, a polyethylene terephthalate film, a polyethernitrile film, a polyethersulfone film may be used.

A material for the wiring pattern 2 is not limited to copper. For example, another metal material such as copper alloy, gold and aluminum may be used.

The present invention is applicable to various types of printed circuit boards such as a flexible printed circuit board and a rigid printed circuit board. In addition, the electronic component 60 is not limited to a semiconductor chip. For example, other electronic components such as a capacitor may be used.

(6) Correspondences Between Elements in the Claims and Parts in Embodiments

In the following paragraph, non-limiting examples of correspondences between various elements recited in the claims below and those described above with respect to various embodiments of the present invention are explained.

In the above-described embodiments, the conductor layer 2a is an example of a conductor pattern, the tip conductor width W3 is an example of a first width, the connection conductor width W1 is an example of a second width, the tip portion 21 is an example of a first region, and the connection portion 22 is an example of a second region.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A connection structure between a printed circuit board and an electronic component that is a connection structure between the printed circuit board and a plurality of terminals of the electronic component, wherein said printed circuit board includes
   an insulating layer, and
   a plurality of conductor patterns corresponding to said plurality of terminals of said electronic component, each conductor pattern having a line shape and being formed on said insulating layer,
   each of said plurality of conductor patterns includes a terminal portion and a signal transmission portion, each terminal portion includes a first region having a first width and a second region having a second width smaller than said first width, and at least said second region is covered with a plating layer including a tin and having a thickness of not less than 0.07 μm and not more than 0.25 μm,
   each signal transmission portion has a third width larger than said second width, said second region is provided between said first region of each terminal portion and each signal transmission portion,
   each of said plurality of terminals of said electronic component is heat-sealed on said second region of the corresponding terminal portion of said printed circuit board,
   wherein one lateral side of each second region is positioned more inward than one lateral side of the corresponding terminal of said electronic component by not less than 0.5 μm, and another lateral side of each second region is positioned more inward than another lateral side of the corresponding terminal of said electronic component by not less than 0.5 μm, a spacing of not less than 20 μm is formed between each first region and the corresponding terminal of said electronic component in a direction perpendicular to a width direction of said terminal portion, a spacing of not less than 20 μm is formed between each signal transmission portion and the corresponding terminal of said electronic component, and
   consecutive terminals of said plurality of terminals of said electronic component are arranged in a row.

2. The connection structure between the printed circuit board and the electronic component according to claim 1, wherein the lateral sides of each second region are positioned more inward than the lateral sides of each first region, respectively.

3. The connection structure between the printed circuit board and the electronic component according to claim 1, wherein said printed circuit board further includes a cover insulating layer formed on said base insulating layer to cover said plurality of conductor patterns excluding said plurality of terminal portions.

4. The connection structure between the printed circuit board and the electronic component according to claim 1, wherein said plurality of terminals of said electronic component are provided at intervals of not more than 10 μm.

* * * * *